United States Patent [19]
Takada

[11] Patent Number: 5,773,154
[45] Date of Patent: Jun. 30, 1998

[54] ARTICLE HAVING A DECORATIVE METAL LAYER, AND METHOD OF PRODUCING THE SAME

[75] Inventor: Nobuhiro Takada, Saitama, Japan

[73] Assignee: Daiwa Seiko, Inc., Tokyo, Japan

[21] Appl. No.: 624,754

[22] Filed: Mar. 27, 1996

Related U.S. Application Data

[63] Continuation of Ser. No. 275,716, Jul. 18, 1994, abandoned.

[30] Foreign Application Priority Data

Jul. 23, 1993 [JP] Japan .................................. 5-202918
Jan. 26, 1994 [JP] Japan .................................. 6-023521

[51] Int. Cl.$^6$ .................................................. B32B 15/08
[52] U.S. Cl. ...................... 428/458; 204/192.1; 427/497; 427/523; 427/525; 428/35.7; 428/35.8; 428/35.9; 428/938
[58] Field of Search .............................................. 428/357

[56] References Cited

U.S. PATENT DOCUMENTS

| | | | |
|---|---|---|---|
| 4,369,225 | 1/1983 | Manabe et al. | 428/334 |
| 4,551,387 | 11/1985 | Manabe et al. | 428/336 |
| 5,028,464 | 7/1991 | Shigetoh | 428/35.9 |

FOREIGN PATENT DOCUMENTS

| | | |
|---|---|---|
| 3333381 | 3/1984 | Germany . |
| 56-117680 | 9/1981 | Japan . |
| 59-4279 | 1/1984 | Japan . |
| 1094785 | 12/1967 | United Kingdom . |
| 94-29127 | 12/1994 | WIPO . |

OTHER PUBLICATIONS

Patent Abstracts of Japan; vol. 011, No. 171 (C–291) 16 Jul. 1985.
Patent Abstracts of Japan; vol. 011, No. 192 (C–249) 19 Jun. 1987.
Patent Abstracts of Japan; vol. 011, No. 297 (C–448) 25 Sept. 1987.
Patent Abstracts of Japan; vol. 016, No. 395 (M–1229) 21 Aug. 1992.

*Primary Examiner*—E. Rollins Buffalow
*Attorney, Agent, or Firm*—Longacre & White

[57] ABSTRACT

An article such as fishing tackle or the like, is provided with an exterior surface which has high strength so that any cracking or separation hardly occurs, has high durability, is light in weight and is decorated to have an aesthetically pleasing appearance. The exterior surface is formed with a synthetic resin coating layer, a thin decorative layer formed through physical vapor deposition with metal, and a transparent or semi-transparent protective layer.

11 Claims, 2 Drawing Sheets

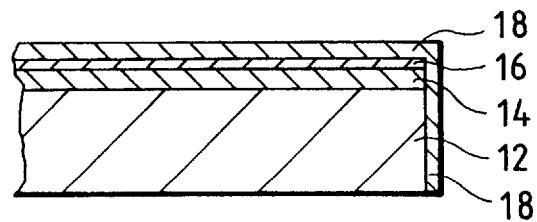
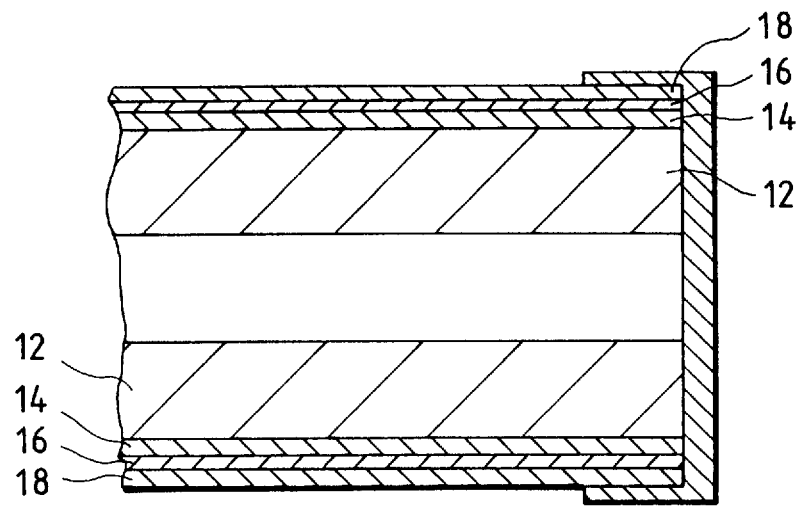
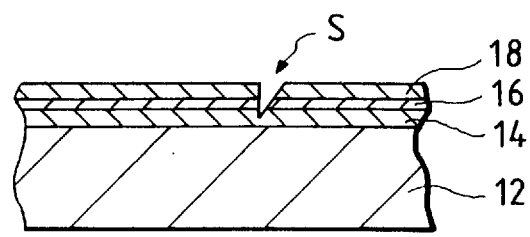

ARTICLE HAVING A DECORATIVE METAL LAYER, AND METHOD OF PRODUCING THE SAME

This is a continuation of application Ser. No. 08/275,716, filed Jul. 18, 1994, which was abandoned upon the filing hereof.

BACKGROUND OF THE INVENTION

1. Field of the Invention

The present invention generally relates to a metal decorative layer. In particular, the present invention relates to a metal decorative layer for sporting goods including fishing rods, fishing reels, lures, tackle boxes, boats, golf club shafts, golf club heads, tennis rackets, badminton rackets, bicycle frames, and similar articles.

2. Description of the Prior Art

As an example, Japanese Utility Model Unexamined Publication No. Sho-56-117680 discloses a fishing rod in which a carbon fiber layer is formed on the surface of a tubular body. A layer of chrome plating is formed on top of the carbon fiber layer so as to provide protection and a decorative, aesthetically pleasing appearance for the fishing rod.

Since the chrome plating layer directly contacts the carbon fiber layer, the chrome plated layer is prone to electric erosion which may cause the plating to become separated from the carbon fiber. Additionally, since the plating layer is comparatively thick, the weight of the rod is unnecessarily increased, and excessive stress such as that caused by bending of the rod during fishing, produces cracks. Further, since the carbon fiber layer generally presents an uneven surface, the plating layer is apt to also be uneven such that the decorative appearance of the plating layer is not aesthetically pleasing.

SUMMARY OF THE INVENTION

An object of the present invention to provide a decorative metal layer which: 1) has sufficient strength so as not to crack or separate from a contiguous adjacent layer, i.e. is durable; 2) is light in weight; and 3) is decorated with an aesthetically pleasing appearance.

Another objective of the present invention is to provide an article comprising a synthetic resin coating layer having a substantially smooth surface covering the exterior of the article, a thin decorative layer is formed on the synthetic resin coating layer by physical metal vapor deposition, and a transparent or semi-transparent protective layer is formed outside on the decorative layer.

Inasmuch as the synthetic resin coating layer is interposed between the surface of the article and the metal decorative layer, it is possible to prevent the metal decorative layer from being electrically eroded, even if the article or the surface of the article is formed of carbon fibers or the like. Alternatively, the article itself can be formed of synthetic resin with a substantially smooth, mirror-like surface.

The metal decorative layer can be formed by physical vapor deposition (PVD) such as vacuum deposition, sputtering, ion plating or the like. Consequently, the metal decorative layer is thinner in thickness and higher in impact resistance than that in the case of ordinary plating. Further, a PVD metal decorative layer is lighter in weight, resistant to separation or a cracking, and since the substrate to the decorative layer has a substantially smooth surface formed, no uneven portions are produced in this thin metal decorative layer. Additionally, a transparent or semi-transparent layer may be used to protect the thin metal decorative layer.

BRIEF DESCRIPTION OF THE DRAWINGS

FIG. 4 illustrates a first aspect of the present invention for protecting a terminus of an article.

FIG. 5 illustrates a second aspect of the present invention for protecting a terminus of an article.

FIG. 6 illustrates yet another aspect of the present invention for hiding surface imperfections of an article.

DETAILED DESCRIPTION OF THE PREFERRED EMBODIMENT

An embodiment of the present invention will be described in detail with reference to the drawings.

Figure 1:
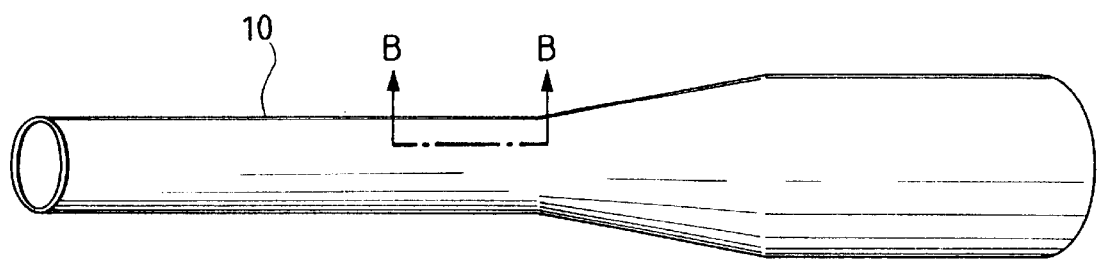
FIG. 1 shows a side view of a fishing rod tube as an example of an article according to the present invention.

FIG. 1 shows a tubular fishing rod body 10 as an example of an article according to the present invention. An exterior layer 12 of the tubular body 10 is formed by winding a fiber-reinforced prepreg having carbon fibers or the like as reinforcing fibers. An insulating synthetic resin coating layer 14 is formed on top of the exterior layer 12 by immersion in a synthetic resin, e.g. epoxy resin.

Although it is preferable that the material for the synthetic resin coating layer 14 be identical with the synthetic resin material used in the exterior layer 12, thereby improving the bond between each other, the materials need not be identical. The surface of the coating layer 14 is substantially smooth, like the surface of a mirror, with minimal surface roughness. A light metal, preferably aluminum or titanium, is vapor-deposited on the coating layer 14 by physical vapor deposition (PVD). PVD technics such as vacuum deposition, sputtering and ion plating are used to form a thin metal, decorative layer 16. The decorative layer 16 preferably has a thickness of several microns or less. Since the surface of the synthetic resin coating layer 14, which forms the substrate for the PVD, is substantially smooth like a surface of a mirror, the decorative layer 16 is also substantially smooth. Consequently, consistency of the surface aesthetics is improved.

Since the insulating synthetic resin coating layer 14 is interposed between the exterior layer 12 and the metal decorative layer 16, it is possible to prevent erosion between these layers. Further, the bond between the substrate and the above-mentioned physical vapor deposition is improved to eliminate separation and minimize cracking of the metal decorative layer 16. Further, since a PVD layer can be formed which is less than about 1 micron thick, a fishing rod or other article can be made light in weight and cracking as a consequence of bending can be virtually eliminated.

A transparent or semi-transparent layer 18 may be formed on top of the decorative layer 16 to provide protection. As such, the protective layer 18 is generally thicker than the synthetic resin coating layer 14 or the metal decorative layer 16. The transparent or semi-transparent layer 18 may be colored with a dye, and in combination with the sheen of the metal decorative layer 16, give a deep and rich appearance to the tubular body 10. Further, if the synthetic resin coating layer 14 has the same or a similar color as that of the metal decorative layer 16, a scratch or flaw which may occur in the metal decorative layer 16 (e.g. as a consequence of the rod body 10 accidentally striking a rock or the like), is not likely to be conspicuous. Additionally, it is envisioned that the protective layer 18 may also be a mat clear layer, a clear layer of paint including beads, a clear layer having a fluorescent color, or a clear layer of paint mixed with particles for preventing stains, odors, adhesion of bacteria, or the like.

Figure 2:
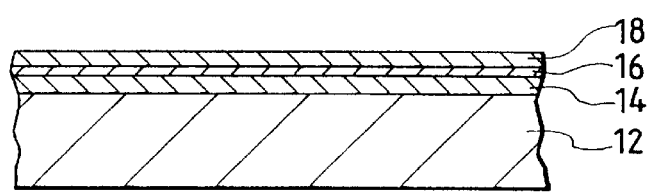
FIG. 2 is an enlarged partial sectional view taken along the line II—II of the article shown in FIG. 1.
Figure 3:
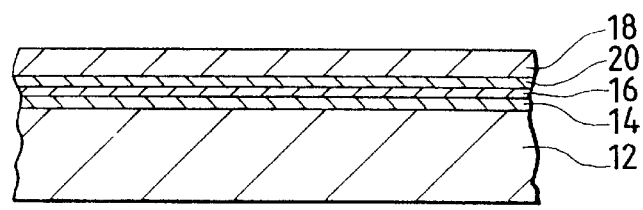
FIG. 3 is an enlarged partial sectional view similar to that of FIG. 2, showing another embodiment of the present invention.

FIG. 3 shows another embodiment of the present invention, and illustrates an enlarged section of an alternate embodiment according to the present invention. In the same manner as the embodiment shown in FIG. 2, an insulating synthetic resin coating layer 14 is formed on the exterior of a tubular body layer 12. A synthetic resin coating layer 14 and a thin metal decorative layer 16 are subsequently formed on top of the tubular body layer 12. In this embodiment, an above-mentioned transparent or semi-transparent color clear layer, a fluorescent color clear layer or the like 20 is formed on top of the metal decorative layer 16, and a transparent or semi-transparent protective layer 18 which is generally thicker than any other layer is formed on top of the layer 20. In this manner, a plurality of protective layers may be formed. Alternatively, a high durability, thin coating may be formed with, for example, an ultraviolet setting paint. Thus, it is possible to provide an article 10 with a deep, bright and aesthetically pleasing appearance. In this case, the protective layer 18 may be omitted, in which case the color clear layer 20 acts as the protective layer.

The color clear layer, or the like, 20 need not be formed over the entire surface of the article 10, but may be formed partially. For example, the layer 20 may be applied in different patterns so as to provide decoration with variety. It is also envisioned that the metal decorative layer 16 may be formed partially on the surface of the base rod 10 such as by partially covering the base rod 10 with a suitable member, or by any other method. Further, a structure in which cloth or the like is to be wound on a grip portion of the article 10 is also within the scope of the present invention.

FIGS. 4 and 5 illustrate different means for protecting the terminus of an article, e.g. the tip or butt end of tubular body 10. According to FIG. 4, the protective layer 18 extends over the longitudinal terminus of the decorative layer 16. Alternatively, a cover 30 may be fitted over any exposed terminus, as shown in FIG. 5.

FIG. 6 illustrates an advantage according to the present invention wherein the presence of a surface imperfection such as a crack is made less conspicuous. Specifically, if the synthetic resin coating layer 14 below the decorative layer 16 is made to be the same color as the decorative layer 16, penetrations of the decorative layer 16 will be less visible upon a cursory inspection.

Further, as mentioned above, the present invention can also be applied to any number of fishing goods including rods, reels, lures, tackle boxes, as well as boats and other supplies; shafts and heads of golf clubs; tennis rackets; badminton rackets; bicycle frames; or the like. The articles 10 may also be constructed from materials other than fiber-reinforced synthetic resin material, including metal materials including alloys such as an aluminum alloy and magnesium alloy as well as non-reinforced synthetic resin materials. In the case of a synthetic resin material, it is preferable that the surface is formed so as to be substantially smooth, like a mirror surface, before the metal-deposition decorative layer is formed thereon. However, in order to improve the adhesion of the deposition metal to an article body, a synthetic resin coating layer having a surface formed to be substantially smooth may be formed of any kind of synthetic resin other than that of the article body.

According to the present invention, since an insulating synthetic resin coating layer is formed between an article body and a metal decorative layer, it is possible to prevent erosion even if the article body or a surface portion thereof consists of materials causing electric erosion with metal. In the case of physical vapor deposition, not only the bond with a substrate is superior, but also separation and cracking of the metal decorative layer are virtually eliminated. Further, since a deposition layer formed by physical vapor deposition can be made exceptionally thin, an article such as a fishing rod or the like can be made light in weight. At the same time, cracking is minimized even if transformation such as bending occurs. Due to the existence of a protective layer, the thin metal decorative layer is protected for the sake of increased durability and to maintain the aesthetic qualities of the decoration for a long time. In addition, since the surface of the synthetic resin coating layer, which is the substrate surface on which deposition occurs, is formed so as to be substantially smooth, the decorative layer is also formed to be smooth so that the aesthetic qualities are further improved. It is therefore possible to provide an article which has high strength to minimize any cracking or separation, is durable, is light in weight and is decorated to achieve an aesthetically pleasing appearance.

What is claimed is:

1. An article having an exterior surface formed of at least one of a fiber reinforced electrically conductive synthetic resin and a metal, said article comprising:

an insulating synthetic resin coating layer void of electrically conductive fiber and having a substantially smooth surface contiguous with the exterior surface;

an electrically conductive metallic decorative layer contiguous with said synthetic resin coating layer, wherein said synthetic resin coating layer electrically insulates said decorative layer from said exterior surface to prevent electrical erosion thereof caused by a potential difference existing between the decorative layer and said exterior surface; and a protective layer on top of said decorative layer.

2. The article according to claim 1, wherein said decorative layer is formed through physical metal vapor deposition.

3. The article according to claim 2, wherein said physical metal vapor deposition includes vacuum deposition.

4. The article according to claim 2, wherein said physical metal vapor deposition includes sputtering.

5. The article according to claim 2, wherein said physical metal vapor deposition includes ion plating.

6. The article according to claim 1, wherein said protective layer is transparent.

7. The article according to claim 1, wherein said protective layer is semi-transparent.

8. The article according to claim 1, wherein said synthetic resin coating layer comprises a first color and said decorative layer comprises a second color which is the same as said first color.

9. The article according to claim 1, further comprising:

edge covering means for shielding said decorative layer at an edge of the article, wherein said edge covering means overlies said edge of the article.

10. The article according to claim 9, wherein said edge covering means includes a cover overlying said protective layer.

11. The article according to claim 9, wherein said edge includes said protective layer which is provided on top of said decorative layer.

* * * * *